United States Patent
Hammer

(10) Patent No.: US 6,897,112 B2
(45) Date of Patent: May 24, 2005

(54) METHOD FOR FABRICATING AN INTEGRATED SEMICONDUCTOR CONFIGURATION WITH THE AID OF THERMAL OXIDATION, RELATED SEMICONDUCTOR CONFIGURATION, AND RELATED MEMORY UNIT

(75) Inventor: Markus Hammer, Saal A.D. Donau (DE)

(73) Assignee: Infineon Technologies AG, Munich (DE)

( * ) Notice: Subject to any disclaimer, the term of this patent is extended or adjusted under 35 U.S.C. 154(b) by 83 days.

(21) Appl. No.: 10/262,148

(22) Filed: Oct. 1, 2002

(65) Prior Publication Data

US 2003/0068873 A1 Apr. 10, 2003

(30) Foreign Application Priority Data

Oct. 1, 2001 (DE) .......................................... 101 48 491

(51) Int. Cl.[7] ..................... H01L 21/336; H01L 21/302; H01L 31/062; H01L 31/058
(52) U.S. Cl. ....................... 438/258; 438/261; 438/592; 438/702; 438/756; 257/411; 257/414; 257/467; 257/519
(58) Field of Search ................................ 438/702, 756, 438/257–268, 240, 708, 738; 257/314, 315, 411–467, 519

(56) References Cited

U.S. PATENT DOCUMENTS

| 4,814,291 | A | * | 3/1989 | Kim et al. .................. 438/593 |
| 5,120,670 | A | * | 6/1992 | Bergmont .................. 438/261 |
| 5,219,766 | A | * | 6/1993 | Fukunaga .................. 438/443 |
| 5,298,436 | A | * | 3/1994 | Radosevich et al. ........ 438/396 |
| 5,422,291 | A | | 6/1995 | Clementi et al. |
| 5,496,756 | A | * | 3/1996 | Sharma et al. .............. 438/258 |
| 5,592,002 | A | * | 1/1997 | Kanamori .................... 257/321 |
| 5,665,620 | A | * | 9/1997 | Nguyen et al. ............. 438/593 |
| 5,700,712 | A | * | 12/1997 | Schwalke .................... 438/430 |
| 5,939,131 | A | * | 8/1999 | Kim et al. .................... 427/81 |
| 6,063,666 | A | * | 5/2000 | Chang et al. ............... 438/261 |
| 6,136,641 | A | * | 10/2000 | Won et al. ................... 438/240 |
| 6,303,483 | B1 | * | 10/2001 | Kunikiyo .................... 438/592 |
| 6,348,380 | B1 | * | 2/2002 | Weimer et al. ............. 438/257 |
| 6,465,335 | B1 | * | 10/2002 | Kunikiyo .................... 438/592 |
| 6,468,915 | B1 | * | 10/2002 | Liu .............................. 438/706 |
| 6,524,914 | B1 | * | 2/2003 | He et al. ..................... 438/264 |
| 6,525,384 | B2 | * | 2/2003 | Hu et al. ..................... 257/411 |
| 6,531,364 | B1 | * | 3/2003 | Gardner et al. ............. 438/287 |

(Continued)

OTHER PUBLICATIONS

Alvi, N. S. et al.: "Thin Polyxide Films Grown by Rapid Thermal Processing", IEEE Electron Device Letters, vol. EDL–8, No. 5, May 1987, pp. 197–199.

(Continued)

*Primary Examiner*—Michael Lebentritt
(74) *Attorney, Agent, or Firm*—Laurence A. Greenberg; Werner H. Stemer; Gregory L. Mayback

(57) ABSTRACT

A method for fabricating an integrated semiconductor configuration includes generating a polycrystalline layer at a surface of a base layer and doping the polycrystalline layer. An oxide layer is generated at the polycrystalline layer by rapid thermal oxidation so that the polycrystalline layer can be precisely structured. The method further includes structuring the main layer and performing the thermal oxidation at temperatures above 900° C. for less than 65 seconds. The method also includes carrying out the thermal oxidation as an initial processing step (after generating the main layer) at a temperature of at least substantially equal to the temperature for generating the main layer. A related semiconductor configuration and memory unit are also provided.

21 Claims, 2 Drawing Sheets

U.S. PATENT DOCUMENTS

| | | | | |
|---|---|---|---|---|
| 6,573,197 | B2 | * | 6/2003 | Callegari et al. ............ 438/791 |
| 6,575,153 | B2 | * | 6/2003 | Lommasson et al. ....... 124/25.6 |
| 6,605,497 | B2 | * | 8/2003 | Yamazaki et al. ........... 438/166 |
| 6,605,521 | B2 | * | 8/2003 | Ajmera et al. ............... 438/595 |
| 6,624,023 | B1 | * | 9/2003 | Han et al. .................... 438/257 |
| 6,673,668 | B2 | * | 1/2004 | Kim et al. .................... 438/240 |
| 6,674,138 | B1 | * | 1/2004 | Halliyal et al. .............. 257/411 |
| 6,764,883 | B1 | * | 7/2004 | Dokumaci et al. ........... 438/149 |

OTHER PUBLICATIONS

Lai, W. H. et al.: "Growth Characterization of Rapid Thermal Oxides", J. Vac. Sci. Technol. B 17 (5), Sep./Oct. 1999, pp. 2226–2238.

Lee, S. K. et al.: "Effects of Rapid Thermal Processing on Thermal Oxides of Silicon", J. Appl. Phy. 60 (9), Nov. 1, 1986, pp. 3360–3363.

* cited by examiner

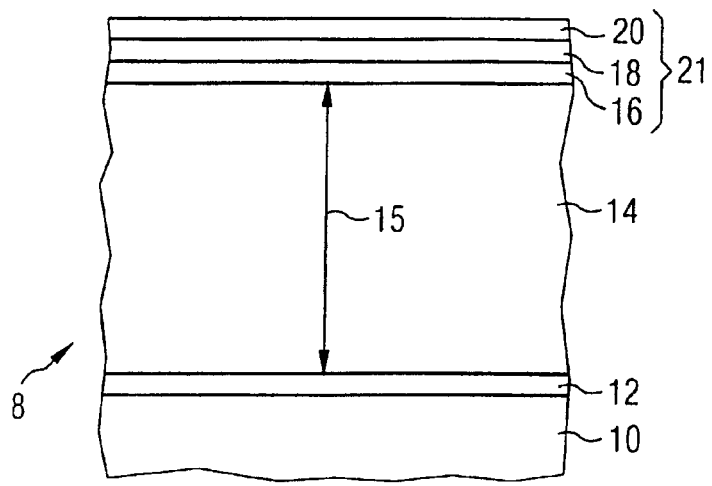
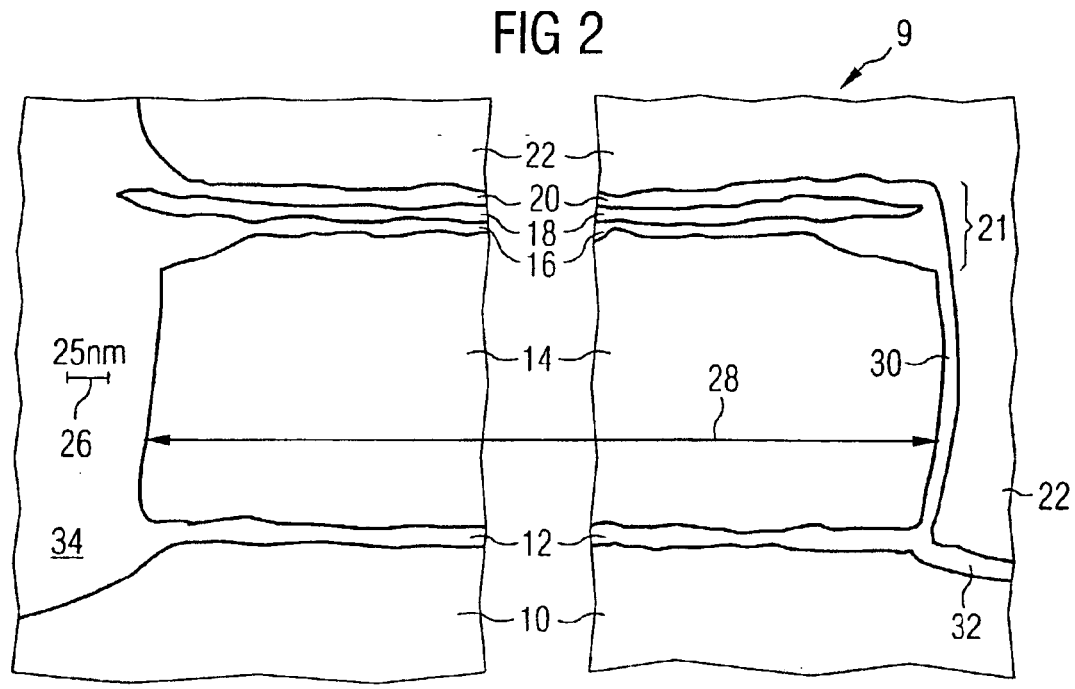

METHOD FOR FABRICATING AN INTEGRATED SEMICONDUCTOR CONFIGURATION WITH THE AID OF THERMAL OXIDATION, RELATED SEMICONDUCTOR CONFIGURATION, AND RELATED MEMORY UNIT

BACKGROUND OF THE INVENTION

Field of the Invention

The invention relates to a method where a main layer (for instance, an amorphous or polycrystalline layer) is deposited on a substrate or a base layer. The invention also relates to a corresponding semiconductor and a memory unit. However, such conventional methods and devices have been complicated and have not provided good structuring of the main layer.

SUMMARY OF THE INVENTION

It is accordingly an object of the invention to provide a method for fabricating an integrated semiconductor configuration, a related semiconductor configuration and a related memory unit that overcome the hereinafore-mentioned disadvantages of the heretofore-known methods and devices of this general type, that are simple and that permit good structuring of the main layer.

With the foregoing and other objects in view, there is provided, in accordance with the invention, a method which includes the steps of generating and depositing a main layer (for instance an amorphous or polycrystalline layer) on a substrate or a base layer. Further, in the method, the main layer is doped during or after the deposition. An oxide layer is generated on the main layer by thermal oxidation before structuring the main layer. Next, the main layer is structured. The thermal oxidation is carried out at temperatures above 900° C. for less than 65 seconds (i.e., in rapid thermal processing, "RTP").

Furthermore, the thermal oxidation (after the deposition of the main layer) is the initial (first) processing step having a processing temperature above or approximately equal to the processing temperature in the depositing of the main layer. After the rapid thermal process, the main layer would be polycrystalline (even if the main layer were originally amorphous).

The invention is based on the concept that the grain structure of the main layer is determined substantially by the step following the depositing of the main layer. If this next step is a RTP step, a grain structure results, which is highly favorable for the structuring of a polycrystalline material (particularly, with respect to the grain size and the smooth grain boundaries).

According to the method, a thermal oxidation is carried out at the same time as the RTP step to generate an oxide layer (having a thickness of several nanometers) on the main layer. If the polycrystalline layer is doped after its deposition, then the RTP step results in annealing.

In other words, the RTP has three functions: namely, generating an advantageous base grain structure, effectuating oxidation in an oxygen atmosphere, and achieving annealing.

Further, the oxide layer (generated on the main layer) is deposited on the whole main layer. The oxide layer is structured prior to the structuring of the polycrystalline layer. As a result, it is not necessary to deposit and structure additional layers after the deposition of the main layer in order to guarantee a strictly local growth of the oxide layer. The processing steps for depositing additional layers would adversely affect the base structure of the monocrystalline grains in the polycrystalline layer with respect to the later structuring of the layer.

In accordance with another mode of the invention, the base layer is an oxide layer borne by the substrate. The base layer is located directly on the surface of the substrate. However, additional layers may also be disposed between the base layer and the substrate.

In accordance with a further mode of the invention, the substrate is exposed in regions during structuring without itself being attacked. Alternatively, the base layer is exposed in regions during structuring without itself being attacked. Such precise structuring can be performed with the aid of a plasma etching process only if the polycrystalline layer contains suitable crystal grains for the etching process. Thus, a suitable base structure of the crystal grains can be achieved with the method.

Residues of the main layer in the exposed regions, or etchings into the base layer or the substrate in the exposed regions, can be detected indirectly by looking at several components at once in the form of a cumulative deterioration of their electronic characteristics. This results in an improvement of the characteristics, which is observable by examining several components at once and which indicates that residues and etched-in locations are no longer present (at least, not on any significant scale with respect to the electrical function of the components).

In accordance with an added mode of the invention, a dielectric layer is deposited on the oxide layer subsequent to the thermal oxidation and prior to the structuring. The dielectric layer may also be structured prior to the structuring of the polycrystalline layer. The dielectric layer may be formed of a different material than the oxide layer. This results in a stack of electrically isolating layers having particularly good isolating characteristics.

In accordance with an additional mode of the invention, the dielectric layer may be selected from a group of a nitride layer, a silicon nitride layer and oxinitride layers.

In accordance with yet another mode of the invention, an oxide layer is deposited on the dielectric layer after the deposition of the dielectric layer and before the structuring of the dielectric layer. Likewise, the oxide layer may be structured prior to the structuring of the main layer. Thus, a stack of at least three isolation layers results, which has particularly good isolating characteristics (given an optimally low stack height). For instance, the layer stack is an oxide nitride oxide or oxinitride nitride oxide ("ONO") stack.

In accordance with yet a further mode of the invention, the oxide layer contains silicon dioxide.

In accordance with yet an added mode of the invention, an electrically conductive layer is incorporated into a depression that is created during the structuring of the main layer. At least a portion of the electrically conductive layer remains in the depression, and thus becomes part of an electronic component.

In accordance with yet an additional mode of the invention, a portion of the electrically conductive layer remains in the depression, and a portion of the layer remains outside the depression. If the portions are conductively connected, they form parts of the same component. The method is particularly suitable for fabricating a control terminal of a storage transistor.

In accordance with again another mode of the invention, the method includes fabricating control terminals for "split gate memory cells". The individual memory cells are 0.5 μm wide on the small side. However, the method can also be used for smaller cell sizes such as 0.35 μm.

In accordance with again a further mode of the invention, the substrate may be formed of a semiconductor material having a specific electrical resistance between $10^{-4}$ Ωcm and $10^{+12}$ Ωcm (for example, a silicon wafer). The main layer may include polycrystalline silicon. The base layer may be an oxide layer that is generated on the substrate by thermal oxidation. These materials are suitable for simple processing.

In accordance with again an added mode of the invention, the time for thermal oxidation is between 3 and 35 seconds, preferably 5 seconds. A time of 5 seconds is particularly expedient, since the base structure of the grains required for a good structuring of the polycrystalline layer is already achieved, and since continuing the thermal oxidation leads to undesirably large oxide layers and to potential damage of the polycrystalline layer.

In accordance with again an additional mode of the invention, the temperature for the thermal oxidation is in the range between 1000° C. and 1100° C. The temperature preferably equals 1050° C. This temperature makes a short RT process possible without damaging the polycrystalline structure too much by high temperatures.

In accordance with a concomitant mode of the invention, the thermal oxidation is carried out in a rapid thermal processing (RTP) apparatus. For instance, the main layer is heated with a hot graphite plate or a high-power lamp. Heating can occur on one or both sides.

With the objects of the invention in view, there is also provided a semiconductor configuration including a substrate, a base layer disposed on the substrate, and a structured polycrystalline main layer disposed on the base layer. The polycrystalline main layer is heated to a temperature above 900° C. for less than 65 seconds in a thermal oxidation process before being structured. The thermal oxidation is a first (i.e., initial) step, following a depositing of the polycrystalline main layer, to be carried at a temperature at least substantially equal to the temperature in the deposition of the polycrystalline main layer. The invention also includes an isolation layer generated by thermal oxidation, which is disposed on the main layer.

With the objects of the invention in view, there is also provided a memory unit which contains the aforementioned semiconductor configuration.

Accordingly, the above-described features also apply to the semiconductor configuration, the memory unit and any developments thereof.

Other features which are considered as characteristic for the invention are set forth in the appended claims.

Although the invention is illustrated and described herein as embodied in a method for fabricating an integrated semiconductor configuration with the aid of thermal oxidation, a related semiconductor configuration, and a related memory unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic cross-sectional view of a layer sequence according to the invention;

FIG. 2 is a fragmentary, cross-sectional view of a storage transistor generated from the layer sequence.

DESCRIPTION OF THE PREFERRED EMBODIMENTS

Figure 3:
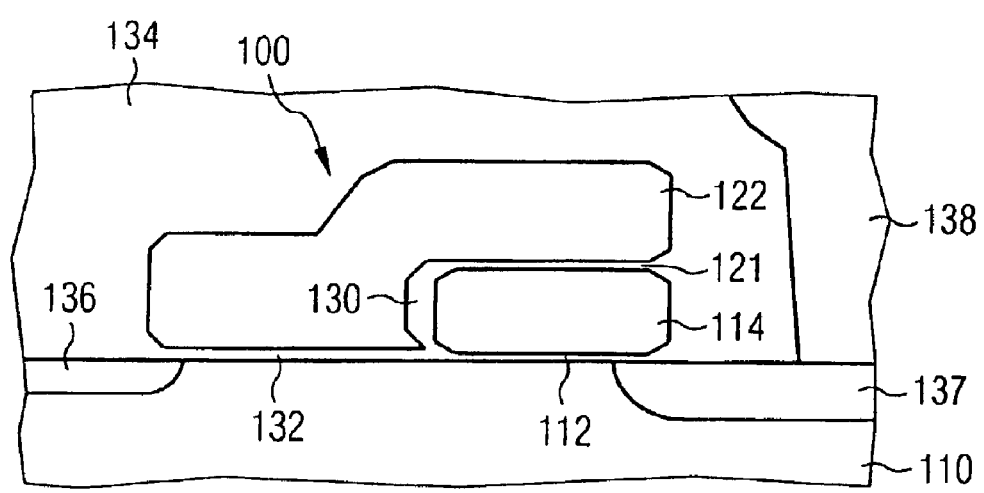
FIG. 3 is a fragmentary, cross-sectional view of a split gate memory cell.

Referring now to the figures of the drawings in detail and first, particularly to FIG. 1 thereof, there is shown a cross-section of a layer sequence 8, which has been applied on a silicon semiconductor wafer 10 with the aid of the following steps:

A silicon dioxide layer 12 with a thickness of several nanometers (for instance, 7.5 nm) was generated by thermal oxidation of the semiconductor wafer 10.

A polycrystalline main layer 14 was deposited on the silicon dioxide layer 12 with the aid of a low-pressure CVD method at approximately 630° C. Silane (SiH4) and phosphine (PH3) were used as the reaction products. The polycrystalline layer 14 has a thickness of approximately 200 nm (see arrow 15).

The polycrystalline layer 14 was heavily doped with phosphorous by the phosphine portion during deposition. For example, the phosphorous content may equal $3 \times 10^{20}$ atoms per $cm^3$.

Following the generation of the polycrystalline layer 14, a rapid thermal oxidation step was carried out at 1050° C. for 5 seconds to generate a thin silicon dioxide layer 16 on the polycrystalline layer 14 and to improve the grain structure of the polycrystalline layer 14 (with respect to its later structuring). The silicon dioxide layer 16 has a thickness of approximately 6 nm.

Next, a thin nitride layer 18 was deposited on the silicon dioxide layer with the aid of a CVD technique. The nitride layer 18 is formed of silicon nitride and has a thickness of 5 nm.

Then, a thin silicon dioxide layer 20 was deposited on the nitride layer 18 with the aid of a CVD technique. The silicon dioxide layer 20 has a thickness of 7 nm.

The silicon dioxide layer 16, the nitride layer 18, and the silicon dioxide layer 20 form an ONO layer stack 21.

FIG. 2 shows a cross-section of a storage transistor 9, which results from a further processing of the layer sequence 8. FIG. 2 is a direct reproduction of a transmission electron microscope ("TEM") picture of the memory transistor 9. This accounts for the curled edges. The storage transistor 9 contains a control electrode 22. The control electrode 22 is disposed over the polycrystalline layer 14 and adjacent the polycrystalline layer 14 (on the right side).

FIG. 2 is a true-to-scale image of the storage transistor 9. The scale 26 indicates that 1 cm (in FIG. 2) corresponds to 25 nm of the storage transistor 9. FIG. 2 represents only the edge regions of the storage electrode, which is formed by the polycrystalline layer 14 of the storage transistor. The polycrystalline layer 14 extends to approximately 550 nm in the lateral direction after it is structured (see arrow 28).

After the steps described in connection with FIG. 1, the following steps were performed:

A photoresist layer was applied to the layer stack 8. The photoresist layer was exposed according to an exposure mask. The photoresist was developed so that a photoresist region remains over the polycrystalline layer 14.

The layers 20, 18, 16 and 14 were structured (in that order) with the aid of a plasma etching process. Suitable etchants were utilized for etching the layers 20, 18, 16 and 14, respectively. The last step in the etching process was performed with an etchant that etches polysilicon selectively with respect to silicon dioxide. The etch rates differ at least by a factor of 10. The etching process was stopped on the surface of the silicon dioxide layer 12.

Next, an oxide sidewall 30 was generated on the sidewalls of the polycrystalline layer 14 by thermal oxidation. During the thermal oxidation, a silicon dioxide layer 32, which is thicker than the silicon dioxide layer 12 and which later isolates the control electrode 22 from the silicon wafer 10, resulted in the exposed regions of the silicon dioxide layer 12.

Next, a polycrystalline layer was deposited and structured, and the control electrode 22 was produced. An intermediate oxide layer was deposited in a region 34.

FIG. 3 shows a cross-section of a split gate memory cell 100, which is disposed on a silicon substrate 110 and which is constructed like the memory cell 9, except that a control electrode extends from the region above a storage electrode 114 to the left side of the storage electrode 114.

The storage electrode 114 is disposed on a silicon dioxide layer 112 that acts as a tunnel oxide. An ONO layer stack 121 (on which a top part of a control electrode 122 sits) is disposed on the side of the storage electrode 114 that faces away from the silicon dioxide layer 112. An oxide sidewall (layer) 130 is disposed between the sidewall of the storage electrode 114 and the control electrode 122.

A silicon dioxide layer 132 is disposed between the part of the control electrode 122 nearer the substrate 110 and the substrate 110. The silicon dioxide layer 132 acts as a high-voltage gate oxide for voltages up to 16 volts. A region 134 is filled with an isolating intermediate oxide.

The control electrode 122 and the storage electrode 144 are bounded by a doped source zone 136 and a doped drain zone 137, which have been integrated into the substrate 110. A metallization 138 which has been included in a via extends to the drain zone 137.

In one exemplary embodiment, a stack memory cell is fabricated by applying the same method as above. In the stack memory cell, the control electrode is located only over the storage electrode. The drain zone and source zone adjoin the storage electrode directly.

As a result of the above-described processing, the polysilicon of the polycrystalline layer (i.e., of the storage electrode) acquires a grain structure that is optimally suited to subsequent structuring. For instance, grain limits of grains with a diameter of approximately 200 nm result. The roughness at the surface of the storage electrode is also reduced.

I claim:

1. A method for fabricating an integrated semiconductor configuration, which comprises the steps of:
    generating a main layer at a given temperature on one of a surface of a substrate and a base layer;
    doping the main layer no earlier than during the generating step;
    generating an oxide layer on the main layer by thermal oxidation at temperatures above 900° C. for less than 65 seconds, and carrying out the thermal oxidation as an initial processing step after the step of generating the main layer with a temperature at least substantially equal to the given temperature; and
    structuring the main layer.

2. The method according to claim 1, which further comprises the steps of:
    generating the oxide layer on a totally exposed surface of the main layer; and
    structuring the oxide layer prior to the structuring of the main layer.

3. The method according to claim 1, wherein the base layer is an oxide layer generated on the surface of the substrate.

4. The method according to claim 1, which further comprises:
    performing at least one of:
        exposing the substrate in regions without attacking the substrate during structuring; and
        exposing the base layer in regions without attacking the base layer during structuring.

5. The method according to claim 1, which further comprises the step of:
    performing at least one of:
        generating a dielectric layer after the thermal oxidation and before the structuring; and
        structuring the dielectric layer before the structuring of the main layer.

6. The method according to claim 1, wherein the dielectric layer is selected from the group consisting of a nitride layer, a silicon nitride layer and an oxinitride layer.

7. The method according to claim 5, which further comprises performing at least one of the steps of:
    generating an oxide layer after the generation of the dielectric layer and before the structuring thereof; and
    structuring the oxide layer before the structuring of the main layer.

8. The method according to claim 7, wherein the oxide layer contains silicon dioxide.

9. The method according to claim 7, which further comprises the steps of:
    creating a depression during the structuring of the main layer; and
    integrating an electrically conductive layer into the depression.

10. The method according to claim 9, which further comprises the step of:
    performing at least one of:
        leaving a portion of the electrically conductive layer inside the depression and leaving another portion outside the depression;
        conductively connecting the two portions;
        isolating the two portions from one another; and
        forming a control terminal of a storage transistor with the two portions.

11. The method according to claim 10, wherein the control terminal is a split gate terminal.

12. The method according to claim 10, which further comprises at least one of the steps of:
    forming the substrate from a semiconductor material;
    providing the main layer as a polycrystalline silicon layer; and
    providing the base layer as an oxide layer generated on the substrate by thermal oxidation.

13. The method according to claim 12, wherein the semiconductor material is silicon and the oxide layer is a silicon dioxide layer.

14. The method according to claim 1, which further comprises the step of:
carrying out at least one of:
performing the thermal oxidiation for less than 35 seconds;
performing the thermal oxidiation for more than 3 seconds; and
performing the thermal oxidiation for 5 seconds.

15. The method according to claim 1, wherein the temperature for performing the thermal oxidation is under 1150° C.

16. The method according to claim 1, wherein the temperature for performing the thermal oxidation is above 950° C.

17. The method according to claim 1, wherein the temperature for performing the thermal oxidation is substantially 1050° C.

18. The method according to claim 1, wherein the thermal oxidation is carried out in a rapid thermal processing (RTP) apparatus.

19. A semiconductor configuration, comprising:
a substrate;
a base layer disposed on said substrate;
a structured polycrystalline main layer disposed on said base layer at a given temperature, said polycrystalline main layer being heated to a temperature above 900° C. for less than 65 seconds in a thermal oxidation process before being structured; and the thermal oxidation being an initial step, following a depositing of said polycrystalline main layer, to be carried at a temperature at least substantially equal to the given temperature; and
an isolation layer generated by thermal oxidation and disposed on said main layer.

20. The semiconductor configuration according to claim 19, further comprising a dielectric layer selected from the group consisting of a nitride layer, a silicon nitride layer and an oxinitride layer.

21. A memory unit, comprising:
at least one semiconductor configuration including:
a substrate;
a base layer;
an isolation layer generated by thermal oxidation; and
a structured polycrystalline main layer deposited at a given temperature, said main layer being heated to a temperature above 900° C. for less than 65 seconds in a thermal oxidation process before being structured, and the thermal oxidation being an initial step following the deposition of said main layer to be carried at a temperature at least substantially equal to the temperature.

* * * * *